United States Patent
Tang et al.

(10) Patent No.: US 12,244,202 B2
(45) Date of Patent: Mar. 4, 2025

(54) VOICE COIL MOTOR, CAMERA MODULE, AND ELECTRONIC DEVICE

(71) Applicant: Huawei Technologies Co., Ltd., Shenzhen (CN)

(72) Inventors: Wei Tang, Dongguan (CN); Yifan Wang, Shenzhen (CN); Wei Luo, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 230 days.

(21) Appl. No.: 17/782,257

(22) PCT Filed: Dec. 3, 2020

(86) PCT No.: PCT/CN2020/133564
§ 371 (c)(1),
(2) Date: Jun. 3, 2022

(87) PCT Pub. No.: WO2021/110091
PCT Pub. Date: Jun. 10, 2021

(65) Prior Publication Data
US 2023/0008053 A1    Jan. 12, 2023

(30) Foreign Application Priority Data
Dec. 4, 2019    (CN) .......................... 201911229578.3

(51) Int. Cl.
*H02K 41/035*    (2006.01)
*H04N 23/54*    (2023.01)
(Continued)

(52) U.S. Cl.
CPC ..... *H02K 41/0356* (2013.01); *H02K 41/0354* (2013.01); *H04N 23/54* (2023.01);
(Continued)

(58) Field of Classification Search
CPC .......... H02K 41/0354; H02K 41/0356; H04N 23/55; H04N 23/57; H04N 23/687;
(Continued)

(56) References Cited

U.S. PATENT DOCUMENTS 9,778,436 B2 * 10/2017 Lu ............................ G02B 7/09
10,725,266 B2    7/2020 Huang et al.
(Continued)

FOREIGN PATENT DOCUMENTS

CN    101241223 A    8/2008
CN    204101866 U    1/2015
(Continued)

OTHER PUBLICATIONS

Lee Jun Taek, A Lens Moving Apparatus Camera Module and Optical Instrument Including The Same, Oct. 17, 2019, KR 20190117972 (English Machine Translation) (Year: 2019).*

*Primary Examiner* — Alexander A Singh
(74) *Attorney, Agent, or Firm* — Slater Matsil, LLP

(57) ABSTRACT

A voice coil motor including a first magnetic piece, a second magnetic piece, a third magnetic piece, and a counterweight, with the first magnetic piece, the second magnetic piece, the third magnetic piece, and the counterweight radially and sequentially arranged around an optical carrier, a first plurality of coils symmetrically fastened on two sides of the optical carrier, where the first plurality of coils includes a first coil and a second coil, the first coil is disposed opposite the first magnetic piece, and the second coil is disposed opposite the third magnetic piece, a first magnetic sensor, and a first induction magnet disposed opposite the first magnetic sensor. The first magnetic sensor is disposed on a side of the counterweight that is adjacent to the optical (Continued)

carrier, and the first induction magnet is fastened on an outer wall of the optical carrier that is adjacent to the counterweight.

20 Claims, 12 Drawing Sheets

(51) Int. Cl.
  *H04N 23/55* (2023.01)
  *H04N 23/57* (2023.01)
  *H05K 1/14* (2006.01)
  *H05K 1/18* (2006.01)
(52) U.S. Cl.
  CPC ............. *H04N 23/55* (2023.01); *H04N 23/57* (2023.01); *H05K 1/14* (2013.01); *H05K 1/189* (2013.01)
(58) Field of Classification Search
  CPC ........ H04N 23/54; H04N 23/45; H05K 1/189; H05K 1/14; G03B 3/10; G03B 5/02; G03B 2205/0023; G03B 2205/0069; G02B 7/08; G02B 27/646
  USPC ...................................................... 310/12.16
  See application file for complete search history.

(56) References Cited

U.S. PATENT DOCUMENTS

| | | |
|---|---|---|
| 10,921,546 B2 | 2/2021 | Hu et al. |
| 11,196,927 B2 | 12/2021 | Park et al. |
| 2017/0094183 A1 | 3/2017 | Miller et al. |
| 2017/0094187 A1 | 3/2017 | Sharma et al. |
| 2017/0115466 A1* | 4/2017 | Murakami ................ G03B 5/00 |
| 2019/0033613 A1 | 1/2019 | Takimoto et al. |
| 2019/0204531 A1* | 7/2019 | Sugawara ................ G03B 5/06 |
| 2021/0297596 A1* | 9/2021 | Enta ........................ H04N 23/67 |
| 2023/0008053 A1 | 1/2023 | Tang et al. |

FOREIGN PATENT DOCUMENTS

| | | |
|---|---|---|
| CN | 204119344 U | 1/2015 |
| CN | 205139454 U | 4/2016 |
| CN | 205333952 U | 6/2016 |
| CN | 105988262 A | 10/2016 |
| CN | 106059243 A | 10/2016 |
| CN | 207114854 U | 3/2018 |
| CN | 108279468 A | 7/2018 |
| CN | 108631694 A | 10/2018 |
| CN | 207965330 U | 10/2018 |
| CN | 110082884 A | 8/2019 |
| CN | 108476283 B | 11/2019 |
| CN | 111147708 A | 5/2020 |
| EP | 3505985 A1 | 7/2019 |
| JP | 2010112978 A | 5/2010 |
| JP | 2010175974 A | 8/2010 |
| JP | 2016071150 A | 5/2016 |
| KR | 20190117972 A * | 10/2019 |
| TW | 490014 U | 6/2002 |
| WO | 2017049579 A1 | 3/2017 |
| WO | 2018107725 A1 | 6/2018 |

* cited by examiner

VOICE COIL MOTOR, CAMERA MODULE, AND ELECTRONIC DEVICE

CROSS REFERENCE TO RELATED APPLICATIONS

This application is a national stage of International Application No. PCT/CN2020/133564, filed on Dec. 3, 2020, which claims priority to Chinese Patent Application No. 201911229578.3, filed on Dec. 4, 2019. Both of the aforementioned applications are hereby incorporated by reference in their entireties.

TECHNICAL FIELD

This application relates to the field of terminal technologies, and in particular, to a voice coil motor, a camera module, and an electronic device.

BACKGROUND

With popularization of intelligent mobile terminals such as mobile phones and tablet computers, users have also put forward higher requirements for performance of camera modules in the terminals such as focusing and anti-shake. A voice coil motor is an important part in the camera module and is configured to drive a lens to extend and retract.

As shown in FIG. 1, a camera module includes a voice coil motor 101 and a lens assembly 102. One or more magnetic pieces and coils are disposed in the voice coil motor 101. After being electrified, a coil interacts with a magnetic field of a magnetic piece and may drive the lens assembly 102 to move in a direction of an x-axis, a direction of a y-axis, or a direction of a z-axis. Usually, a control circuit, for example, an IC chip, is further disposed in the voice coil motor 101. In a shooting process, a processor of a terminal may send a corresponding control instruction to the IC chip of the voice coil motor 101, to instruct the IC chip to control, after a coil is electrified, the lens assembly 102 to move by a specific distance in the direction of the x-axis, the direction of the y-axis, or the direction of the z-axis. In this way, functions of the lens assembly 102 such as anti-shake and focusing are implemented.

However, because uncontrollable phenomena such as magnetic interference may occur between the plurality of magnetic pieces in the voice coil motor 101, a specific error may occur when the IC chip controls the lens assembly 102 to move. In this case, how to more quickly and precisely control a moving direction and a moving distance of the lens assembly 102 in the voice coil motor 101 becomes an urgent problem to be resolved.

SUMMARY

This application provides a voice coil motor, a camera module, and an electronic device, to improve precision and increase a speed of controlling movement of a lens assembly by the voice coil motor, and further improve focusing and anti-shake performance of the entire camera module.

To achieve the foregoing objective, this application uses the following technical solutions.

According to a first aspect, this application provides a voice coil motor. The voice coil motor includes a first magnetic piece, a second magnetic piece, a third magnetic piece, and a counterweight that are radially arranged around an optical carrier sequentially. First coils are fastened on two sides of the optical carrier. The first coils include two coils. One of the two coils is disposed opposite to the first magnetic piece, and the other of the two coils is disposed opposite to the third magnetic piece.

The voice coil motor further includes a first magnetic sensor and a first induction magnet that are oppositely disposed. The first magnetic sensor is disposed on a side that is of the counterweight and that is close to the optical carrier. The first induction magnet is fastened on an outer wall that is of the optical carrier and that is close to the counterweight. After being electrified, the first coils may drive, under actions of magnetic fields, the optical carrier to move in a direction of an optical axis with the first induction magnet. In this case, the first magnetic sensor may convert a magnetic field signal generated by the first induction magnet into a first electrical signal, to detect a moving direction and a moving distance of the optical carrier in the direction of the optical axis.

It can be learned that in this application, the first magnetic sensor is fastened on the counterweight, instead of being disposed on an FPC substrate that generates heat, which is a case in the conventional technology. Therefore, the first magnetic sensor is far away from a heat source in the voice coil motor, and the heat generated when the FPC substrate operates does not affect detection precision of the first magnetic sensor. In this way, the voice coil motor can implement more precise and faster closed-loop control of a lens assembly in the direction of the optical axis by using the first magnetic sensor and the first induction magnet, thereby improving focusing and anti-shake performance of a camera module.

In a possible implementation, on a plane perpendicular to the direction of the optical axis, a distance between the first induction magnet and the first magnetic piece and a distance between the first induction magnet and the third magnetic piece are equal. In this case, the first magnetic sensor is minimally affected by magnetic fields of the first magnetic piece, the second magnetic piece, and the third magnetic piece, thereby ensuring that the first magnetic sensor can accurately detect a change in the magnetic fields when the first induction magnet moves in the direction of the optical axis.

In a possible implementation, on the plane perpendicular to the direction of the optical axis, the first magnetic sensor is located in the middle of the counterweight. In this case, a distance between the first magnetic sensor and the first induction magnet is the smallest, ensuring detection precision of the first magnetic sensor.

In a possible implementation, one surface of the first magnetic sensor may be directly mounted on the counterweight; or the first magnetic sensor may be fastened on the counterweight by using a support part.

In a possible implementation, a height of the first magnetic sensor in the direction of the optical axis may be equal to a height of the counterweight; or a height of the first magnetic sensor in the direction of the optical axis may be greater than or less than a height of the counterweight.

In a possible implementation, the counterweight may be made of a magnetic insulating material, to reduce magnetic interference caused by the counterweight.

In a possible implementation, the first magnetic piece and the third magnetic piece may be centrosymmetrically disposed with respect to the optical carrier; and the second magnetic piece and the counterweight may be centrosymmetrically disposed with respect to the optical carrier.

In a possible implementation, the voice coil motor further includes an FPC substrate. A driver chip is disposed on the FPC substrate. The driver chip is configured to: receive the first electrical signal transmitted by the first magnetic sensor, and adjust, based on the first electrical signal, a first current signal that is input to the first coils. In this way, closed-loop control of a moving distance and a moving direction of the voice coil motor in the direction of the optical axis is implemented.

In a possible implementation, a through-hole, and a second coil, a third coil, and a fourth coil that are radially arranged around the through-hole sequentially are further disposed on the FPC substrate. The second coil is disposed opposite to the first magnetic piece, the third coil is disposed opposite to the second magnetic piece, and the fourth coil is disposed opposite to the third magnetic piece. In this case, after being electrified, the second coil may drive, under an action of a magnetic field, the optical carrier to move in a first direction (for example, a direction of an x-axis) with the first magnetic piece; and after being electrified, the third coil may drive, under an action of a magnetic field, the optical carrier to move in a second direction (for example, a direction of a y-axis) with the second magnetic piece. In this way, it is implemented that the optical carrier moves on the plane xy.

For example, a second magnetic sensor may be disposed in the second coil, and a third magnetic sensor may be disposed in the third coil. In this way, when the optical carrier moves in the first direction (for example, the direction of the x-axis) with the first magnetic piece, the second magnetic sensor may convert a magnetic field signal generated by the first magnetic piece into a second electrical signal; and when the optical carrier moves in the second direction (for example, the direction of the y-axis) with the second magnetic piece, the third magnetic sensor may convert a magnetic field signal generated by the second magnetic piece into a third electrical signal. As such, three-axis closed-loop control of movement of the lens assembly is implemented in the directions of the x-axis, the y-axis, and the optical axis.

In a possible implementation, the driver chip is further configured to: receive the second electrical signal transmitted by the second magnetic sensor, and adjust, based on the second electrical signal, a second current signal that is input to the second coil, to quickly and precisely control a moving direction and a moving distance of the lens assembly in the first direction. Likewise, the driver chip is further configured to: receive the third electrical signal transmitted by the third magnetic sensor, and adjust, based on the third electrical signal, a third current signal that is input to the third coil, to quickly and precisely control a moving direction and a moving distance of the lens assembly in the second direction. In this way, an anti-shake function of the lens assembly is implemented.

For example, the first magnetic piece and the third magnetic piece may be bipolar magnets, and the second magnetic piece may be a unipolar magnet.

For example, a magnetic force generated by the first magnetic piece may be equal to a magnetic force generated by the third magnetic piece, and a magnetic force generated by the second magnetic piece may be twice the magnetic force generated by the first magnetic piece.

For example, the first magnetic sensor, the second magnetic sensor, or the third magnetic sensor may be specifically a Hall sensor.

According to a second aspect, this application provides a camera module. The camera module includes at least one camera unit. The camera unit includes an optical carrier, a lens assembly mounted in the optical carrier, and a first magnetic piece, a second magnetic piece, a third magnetic piece, and a counterweight that are radially arranged around the optical carrier sequentially. First coils are symmetrically disposed on two sides of the optical carrier. One of the first coils is disposed opposite to the first magnetic piece, and the other of the first coils is disposed opposite to the third magnetic piece. The camera unit further includes a first magnetic sensor and a first induction magnet that are oppositely disposed. The first magnetic sensor is disposed on a side that is of the counterweight and that is close to the optical carrier. The first induction magnet is fastened on an outer wall that is of the optical carrier and that is close to the counterweight.

After being electrified, the first coils may drive, under actions of magnetic fields, the optical carrier to move in a direction of an optical axis with the first induction magnet. In this case, the first magnetic sensor may convert a magnetic field signal generated by the first induction magnet into a first electrical signal, to detect a moving direction and a moving distance, in the direction of the optical axis, of the lens assembly that is in the optical carrier.

It can be learned that the camera module provided in this application includes the foregoing voice coil motor. By using the foregoing voice coil motor, closed-loop control of movement of the lens assembly that is in the optical carrier can be implemented in the direction of the optical axis. In addition, because a position at which the first magnetic sensor is disposed is far away from a heat source of the voice coil motor, a problem that detection precision of the first magnetic sensor is reduced due to temperature can be resolved. Therefore, more precise and faster closed-loop control of the lens assembly is implemented in the direction of the optical axis, thereby improving focusing and anti-shake performance of the camera module.

In a possible implementation, the camera module further includes an FPC substrate. A driver chip is disposed on the FPC substrate. The driver chip is configured to: receive the first electrical signal transmitted by the first magnetic sensor, and adjust, based on the first electrical signal, a first current signal that is input to the first coils, to quickly and precisely control the moving direction and the moving distance of the lens assembly in the direction of the optical axis. In this way, focusing and anti-shake functions of the lens assembly are implemented. The FPC substrate may be disposed in each camera unit of the camera module, or a plurality of camera units of the camera module may share one FPC substrate.

In a possible implementation, a through-hole, and a second coil, a third coil, and a fourth coil that are radially arranged around the through-hole sequentially are further disposed on the FPC substrate. A second magnetic sensor is disposed in the second coil, and a third magnetic sensor is disposed in the third coil. The second coil is disposed opposite to the first magnetic piece, the third coil is disposed opposite to the second magnetic piece, and the fourth coil is disposed opposite to the third magnetic piece.

After being electrified, the second coil may drive the optical carrier to move in a first direction with the first magnetic piece. During moving, the second magnetic sensor may convert a magnetic field signal generated by the first magnetic piece into a second electrical signal. Likewise, after being electrified, the third coil may drive the optical carrier to move in a second direction (the first direction and the second direction are perpendicular to each other) with the second magnetic piece. During moving, the third magnetic sensor may convert a magnetic field signal generated by the second magnetic piece into a third electrical signal.

For example, the driver chip is further configured to: receive the second electrical signal transmitted by the second magnetic sensor, and adjust, based on the second electrical signal, a second current signal that is input to the second coil; and the driver chip is further configured to: receive the third electrical signal transmitted by the third magnetic sensor, and adjust, based on the third electrical signal, a third current signal that is input to the third coil. In this way, the camera module can implement closed-loop control of movement of the lens assembly not only in the direction of the optical axis but also in the first direction and the second direction.

In a possible implementation, the camera module further includes an image sensor that is disposed under the FPC substrate in the direction of the optical axis. The image sensor may receive, through the through-hole on the FPC substrate, an optical signal captured by the lens assembly, and convert the optical signal into an image electrical signal. The image sensor may be disposed in each camera unit of the camera module, or a plurality of camera units of the camera module may share one image sensor.

In a possible implementation, the camera module further includes a substrate that is disposed under the image sensor in the direction of the optical axis. A BTB connector is disposed on the substrate. The substrate may be configured to receive an image electrical signal that is output by the image sensor, and output the image electrical signal by using the BTB connector, for example, output the image electrical signal to a component of an electronic device such as a processor or a main board. The substrate and the BTB connector may be disposed in each camera unit of the camera module, or a plurality of camera units of the camera module may share one substrate and one BTB connector.

According to a third aspect, this application provides an electronic device. The electronic device includes one or more processors, one or more memories, and one or more camera modules according to any one of the second aspect.

It may be understood that the camera module according to the second aspect and the electronic device according to the third aspect provided above may both include the voice coil motor provided above. Therefore, for beneficial effects that can be achieved by the camera module and beneficial effects that can be achieved by the electronic device, refer to the beneficial effects of the voice coil motor provided above. Details are not described herein again.

REFERENCE NUMERALS

200: voice coil motor; 201: optical carrier; 201a: hollow cavity; 202: first magnetic piece; 203: second magnetic piece; 204: third magnetic piece 204; 205: counterweight; 207a: first coil; 207b: first coil; 301: first magnetic sensor; 302: first induction magnet; 303: support part; 303a: first groove; 303b: second groove; 400: FPC substrate; 401: driver chip; 402: support; 403: spring sheet; 404: support piece; 501: through-hole; 502: second coil; 503: third coil; 504: fourth coil; 601: second magnetic sensor; 602: third magnetic sensor; 603: housing; 604: through-hole; 701: lens assembly; 702: image sensor; 703: first substrate; and 704: BTB connector.

DETAILED DESCRIPTION OF ILLUSTRATIVE EMBODIMENTS

The following describes implementations of embodiments of this application in detail with reference to the accompanying drawings.

An embodiment of this application provides a voice coil motor (voice coil motor, VCM). The voice coil motor is an apparatus that can convert electrical energy into mechanical energy. Linear movement and movement with a limited swing angle can be implemented by using the voice coil motor. For example, the voice coil motor may be disposed in a camera module of an electronic device, and be configured to drive a lens in the camera module to move in different directions, to implement functions of the camera module such as focusing and anti-shake.

Figure 1:
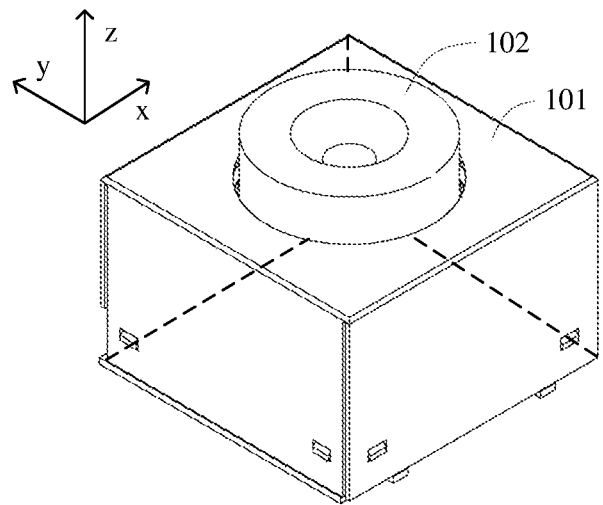
FIG. 1 is a schematic diagram of a structure of a voice coil motor in the conventional technology.
Figure 2:
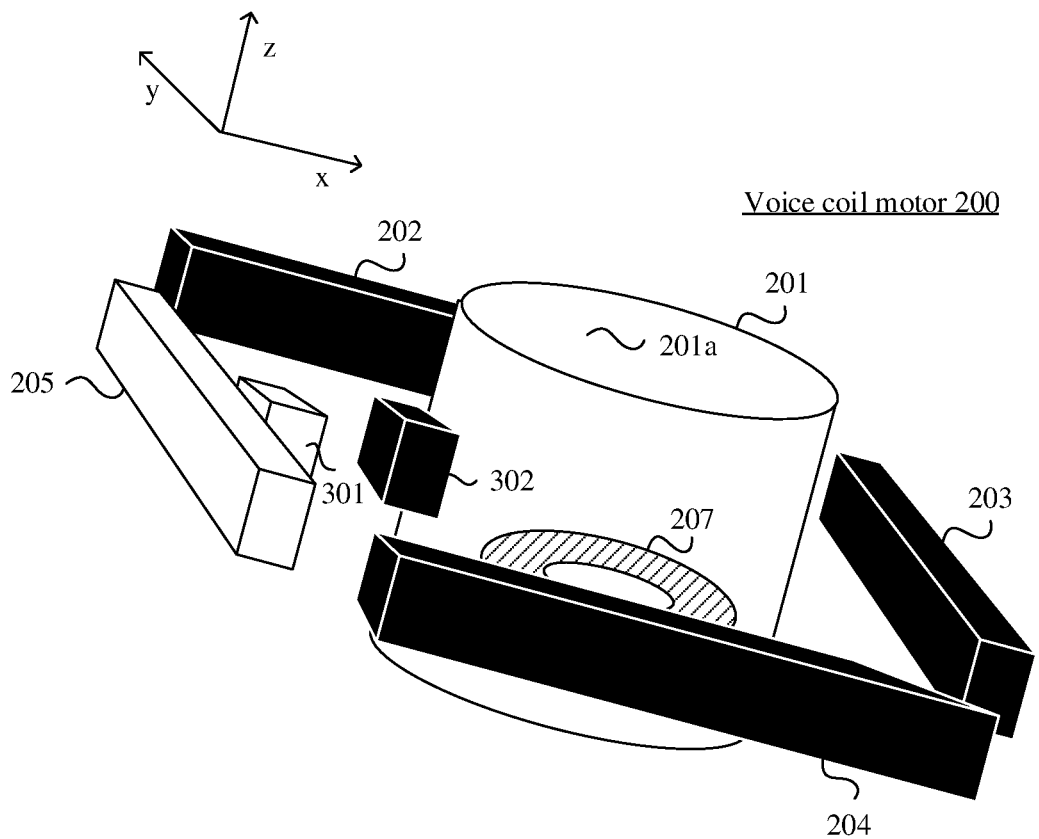
FIG. 2 is a schematic diagram 1 of a structure of a voice coil motor according to an embodiment of this application.

For example, as shown in FIG. 2, a voice coil motor 200 provided in an embodiment of this application may include an optical carrier 201. The optical carrier 201 may be configured to carry a lens assembly of a camera module. The lens assembly may include optical devices configured to take images, such as a camera lens, a polarizer, and a lens holder. For example, still as shown in FIG. 2, the optical carrier 201 may be specifically a hollow structure with a hollow cavity 201a. The lens assembly may be fastened in the hollow cavity 201a. The optical carrier 201 may move in a direction of an x-axis, a direction of a y-axis, or a direction of a z-axis in the voice coil motor 200 with the lens assembly. A direction of an optical axis of the optical carrier 201 is the direction of the z-axis, and a plane perpendicular to the z-axis is a plane on which the x-axis and the y-axis are located. Certainly, the voice coil motor 200 may alternatively not include the optical carrier 201, and the optical carrier 201 may be provided by a vendor producing lens assemblies, camera modules, or electronic devices.

Still as shown in FIG. 2, the voice coil motor 200 provided in this embodiment of this application further includes a first magnetic piece 202, a second magnetic piece 203, a third magnetic piece 204, and a counterweight 205. Around the optical axis (that is, the z-axis) of the optical carrier 201, the first magnetic piece 202, the second magnetic piece 203, the third magnetic piece 204, and the counterweight 205 are radially arranged around the optical carrier 201 sequentially. The first magnetic piece 202 may be disposed opposite to the third magnetic piece 204, and the second magnetic piece 203 may be disposed opposite to the counterweight 205. For example, the first magnetic piece 202 and the third magnetic piece 204 may be centrosymmetrically disposed with respect to the optical carrier 201; and likewise, the second magnetic piece 203 and the counterweight 205 may be centrosymmetrically disposed with respect to the optical carrier 201.

The first magnetic piece 202, the second magnetic piece 203, and the third magnetic piece 204 are elements made of a magnetic material, for example, a magnet. The counterweight 205 is an element made of a non-magnetic material, and is configured to balance a weight of the second magnetic piece 203. For example, the counterweight 205 may be made of a magnetic insulating material, to reduce magnetic interference caused by the counterweight 205.

Figure 3:
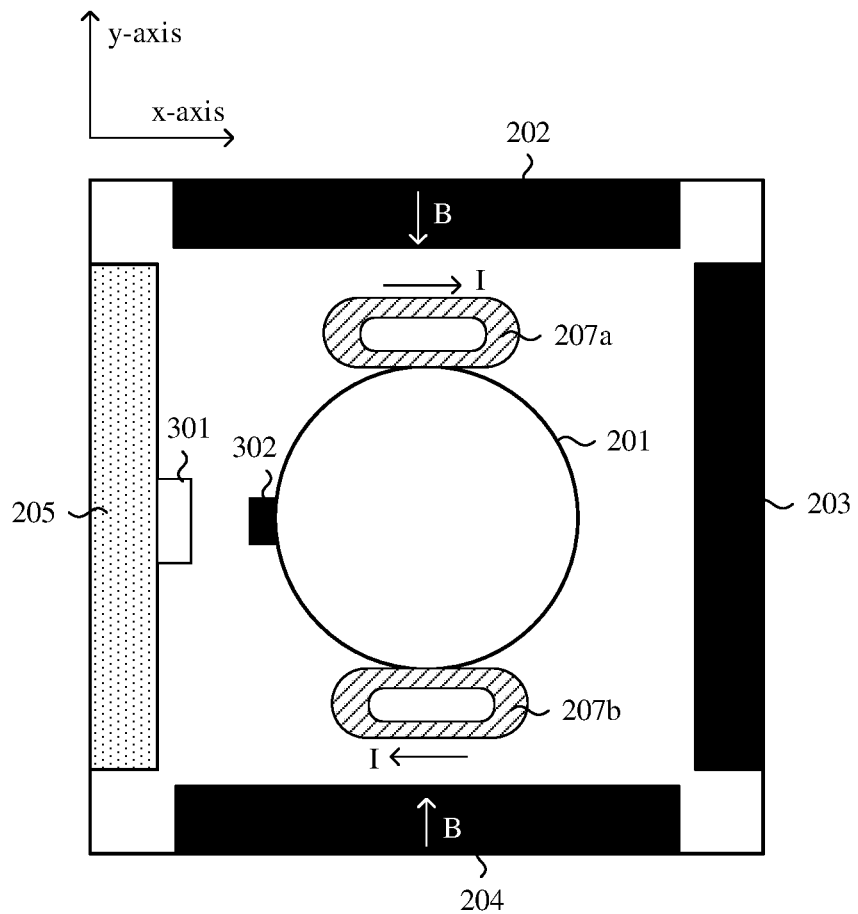
FIG. 3 is a schematic diagram 2 of a structure of a voice coil motor according to an embodiment of this application.

Still as shown in FIG. 2, the voice coil motor 200 provided in this embodiment of this application further includes first coils 207 that are fastened on two sides of the optical carrier 201. FIG. 3 is a schematic diagram of a structure of the voice coil motor 200 on the plane xy on which the x-axis and the y-axis are located. There may be two first coils 207 (that is, a coil 207a and a coil 207b). The coil 207a may be fastened on an outer wall of the optical carrier 201 and disposed opposite to the first magnetic piece 202, and the coil 207b may be fastened on the outer wall of the optical carrier 201 and disposed opposite to the third magnetic piece 204. For example, the coil 207a and the coil 207b may be mounted on the outer wall of the optical carrier 201 by using a fastening support, or the coil 207a and the coil 207b may be directly pasted on the outer wall of the optical carrier 201. A specific manner in which the coil 207a and the coil 207b are fastened on the optical carrier 201 is not limited in this embodiment of this application.

For example, still as shown in FIG. 3, a direction B of a magnetic field of the first magnetic piece 202 may be parallel to the y-axis, and a current direction I existing after the coil 207a is electrified is parallel to the x-axis. In this case, after being electrified, the coil 207a may interact with the magnetic field of the first magnetic piece 202 and generate a Lorentz force parallel to the z-axis. Likewise, a direction B of a magnetic field of the third magnetic piece 204 is also parallel to the y-axis, and a current direction I existing after the coil 207b is electrified is parallel to the x-axis. In this case, after being electrified, the coil 207b interacts with the magnetic field of the third magnetic piece 204 and may also generate a Lorentz force parallel to the z-axis.

In this way, the Lorentz forces generated in the magnetic fields after the first coils 207 are electrified may drive the optical carrier 201 to move in the direction of the z-axis, thereby implementing a focusing or anti-shake function of the lens assembly in the optical carrier 201.

In this embodiment of this application, with reference to the voice coil motor 200 shown in FIG. 2 and FIG. 3, the voice coil motor 200 may further include a first magnetic sensor 301 and a first induction magnet 302 that are oppositely disposed. The first magnetic sensor 301 is disposed on a side that is of the counterweight 205 and that is close to the optical carrier 201. The first induction magnet 302 is disposed on a side that is of the optical carrier 201 and that is close to the counterweight 205. There is no relative movement between the first magnetic sensor 301 and the counterweight 205, and there is no relative movement between the first induction magnet 302 and the optical carrier 201 either. When the optical carrier 201 moves along the z-axis with the lens assembly, the first induction magnet 302 on the optical carrier 201 also moves along the z-axis with the optical carrier 201. In this case, the first magnetic sensor 301 may sense a change in magnetic field distribution of the first induction magnet 302, and convert a magnetic field signal sensed in real time into a corresponding electrical signal (for example, a voltage signal or a current signal).

Figures 4A, 4B:
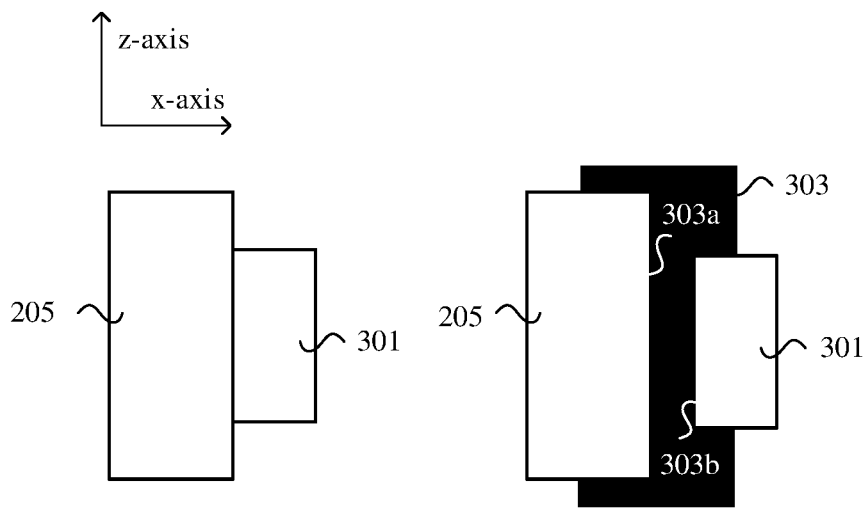
FIG. 4(a) and FIG. 4(b) are a schematic diagram 3 of a structure of a voice coil motor according to an embodiment of this application.

For example, FIG. 4(a) is a schematic diagram of a section of the first magnetic sensor 301 and the counterweight 205 on a plane xz. The first magnetic sensor 301 may be directly mounted on a surface that is of the counterweight 205 and that is close to the optical carrier 201. For example, the first magnetic sensor 301 may be fastened on the optical carrier 201 in a manner of welding or pasting. Alternatively, FIG. 4(b) is a schematic diagram of another section of the first magnetic sensor 301 and the counterweight 205 on a plane xz. The first magnetic sensor 301 may be alternatively mounted, by using a support part 303, on a surface that is of the counterweight 205 and that is close to the optical carrier 201. For example, the support part 303 includes a first groove 303a and a second groove 303b. A direction of an opening of the first groove 303a points to the counterweight 205, and a direction of an opening of the second groove 303b points to the first magnetic sensor 301. The counterweight 205 may be fastened in the first groove 303a, and the first magnetic sensor 301 may be fastened in the second groove 303b, so that the first magnetic sensor 301 is fastened to the counterweight 205. Certainly, a person skilled in the art may alternatively fasten the first magnetic sensor 301 and the counterweight 205 by using another support part. This is not limited in this embodiment of this application.

It should be noted that a height of the first magnetic sensor 301 in the direction of the z-axis may be equal to, greater than, or less than a height of the counterweight 205. This is not limited in this embodiment of this application.

Figure 5:
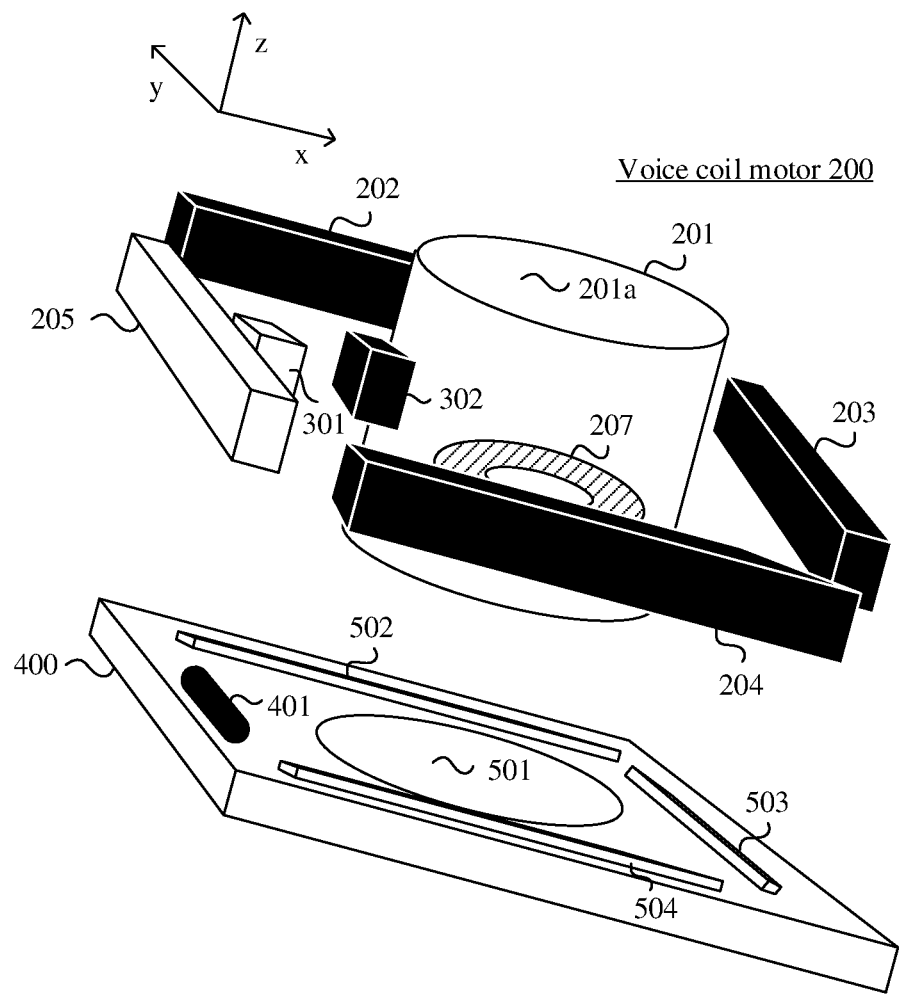
FIG. 5 is a schematic diagram 4 of a structure of a voice coil motor according to an embodiment of this application.

As shown in FIG. 5, the voice coil motor 200 provided in this embodiment of this application may further include an FPC (flexible printed circuit, flexible printed circuit) substrate 400. The FPC substrate 400 is located at the bottom of the entire voice coil motor 200 in the direction of the z-axis, and configured to carry the entire voice coil motor 200 and provide a power output to the voice coil motor 200. For example, the FPC substrate 400 may be configured to input a current of a specific magnitude to the first coils 207, so that after being electrified, the first coils 207 generate, in the magnetic fields, Lorentz forces that are used to drive the optical carrier 201 to move.

Figure 6:
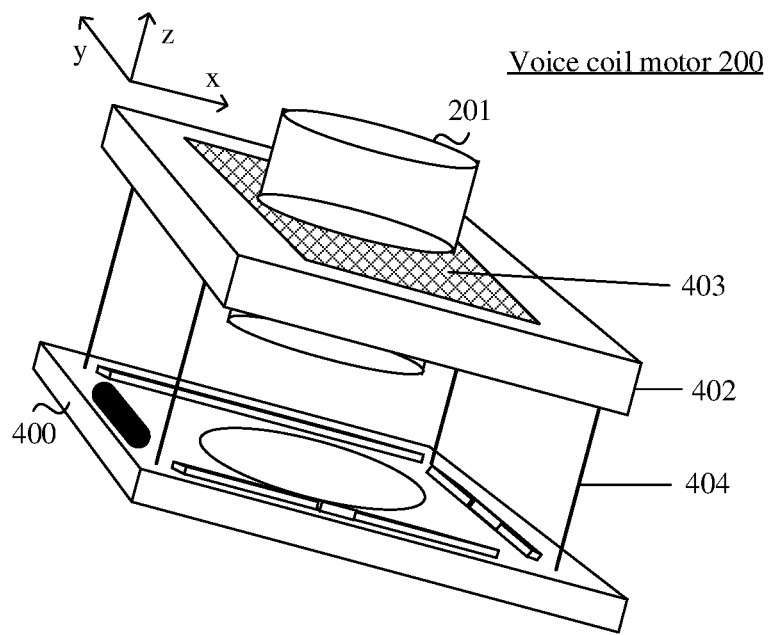
FIG. 6 is a schematic diagram 5 of a structure of a voice coil motor according to an embodiment of this application.

For example, as shown in FIG. 6, the voice coil motor 200 provided in this embodiment of this application may further include a support 402. The support 402 surrounds the optical carrier 201, and is configured to fasten the first magnetic piece 202, the second magnetic piece 203, the third magnetic piece 204, and the counterweight 205 (not shown in FIG. 6). For example, the support part 303 may be a part of the support 402. In this case, the support 402 is further configured to fasten the first magnetic sensor 301. The support 402 is fastened on the FPC substrate 400 by using a support piece 404. For example, the support piece 404 may be a metallic wire (spring wire). In addition, a spring sheet 403 is disposed on the plane xy between the support 402 and the optical carrier 201. The spring sheet 403 may be elastically deformed after being stressed.

In this case, after being electrified, the first coils 207 may generate, under actions of the magnetic fields of the first magnetic piece 202 and the third magnetic piece 204, Lorentz forces that are in the direction of the z-axis, and drive the optical carrier 201 to move in the direction of the z-axis. During moving in the direction of the z-axis, the optical carrier 201 pulls the spring sheet 403, resulting in elastic deformation of the spring sheet 403. By overcoming an elastic force generated by the spring sheet 403 due to elastic deformation, the optical carrier 201 may drive the lens assembly to move in the direction of the z-axis.

In some embodiments, still as shown in FIG. 5, a driver chip (driver IC) 401 is disposed on the FPC substrate 400. The driver chip 401 is a control unit of the entire voice coil motor 200. The first magnetic sensor 301 may be electrically connected to the driver chip 401 through leads (not shown in FIG. 5). Alternatively, the driver chip 401 may be disposed at another position on the voice coil motor 200. For example, the driver chip 401 may be disposed on a housing of the voice coil motor 200. This is not limited in this embodiment of this application. After receiving an electrical signal that is output by the first magnetic sensor 301 in real time, the driver chip 401 may determine a moving distance of the lens assembly in a positive or negative direction of the z-axis based on the electrical signal. Further, the driver chip 401 may adjust, based on the moving distance, a magnitude and direction of a current that is input to the first coils 207, to implement closed-loop control of a moving distance and a moving direction of the voice coil motor 200 in the direction of the z-axis.

For example, during focusing, if the lens assembly is required to move by a distance corresponding to 10 units in the positive direction of the z-axis, a processor of the electronic device may send a first instruction to the driver chip 401 of the voice coil motor 200. The first instruction is used to instruct the voice coil motor 200 to drive the lens assembly to move by a distance of 10 units in the positive direction of the z-axis. The unit may be specifically a distance unit or a current unit. For example, the 10 units in the first instruction may be specifically a distance of 10 microns. In this case, the driver chip 401 may determine, according to a correspondence between different moving distances and input currents, a magnitude of a current I1 that needs to be input to the first coils 207 to drive the lens assembly to move by 10 microns. For another example, the 10 units in the first instruction may be specifically a current of 10 milliamperes. In this case, the driver chip 401 may input a current I1 with a magnitude of 10 milliamperes to the first coils 207.

After being electrified, the first coils 207 drive, under the actions of the magnetic fields, the lens assembly in the optical carrier 201 to move along the z-axis. Because the first induction magnet 302 on the optical carrier 201 also moves along the z-axis with the optical carrier 201, the first magnetic sensor 301 may convert a sensed magnetic field signal of the first induction magnet 302 into a real-time electrical signal and send the real-time electrical signal to the driver chip 401. The driver chip 401 may determine, based on the electrical signal that is output by the first magnetic sensor 301 in real time, whether the lens assembly moves by a distance of 10 units in the positive direction of the z-axis. If a moving distance of the lens assembly in the positive direction of the z-axis is less or greater than a preset value (for example, 10 units), the driver chip 401 may change the current that is input to the first coils 207, for example, adjust the current I1 to a current I2, to implement closed-loop control of movement of the voice coil motor 200 in the direction of the z-axis. In this way, the focusing function of the lens assembly in the direction of the z-axis is quickly implemented.

For another example, during anti-shake processing, if the lens assembly is required to stabilize at a position corresponding to a fifteenth unit in the positive direction of the z-axis, the driver chip 401 of the voice coil motor 200 may determine a position of the lens assembly on the z-axis based on an electrical signal that is output by the first magnetic sensor 301 in real time. Once detecting that the lens assembly deviates from the position corresponding to the fifteenth unit in the positive direction of the z-axis, the driver chip 401 may change a magnitude and direction of a current that is input to the first coils 207, to implement closed-loop control of movement of the voice coil motor 200 in the direction of the z-axis. In this way, the anti-shake function of the lens assembly in the direction of the z-axis is quickly implemented.

In addition, the FPC substrate 400 generates heat when operating. If the first magnetic sensor 301 is disposed on the FPC substrate 400, detection precision of the first magnetic sensor 301 is reduced due to an impact from a temperature change. Therefore, in this embodiment of this application, the first magnetic sensor 301 is fastened on or near the counterweight 205, instead of being disposed on the FPC substrate 400. In this case, the first magnetic sensor 301 is far away from the heat source in the voice coil motor 200, and the heat generated when the FPC substrate 400 operates does not affect detection precision of the first magnetic sensor 301. In this way, the voice coil motor 200 can implement more precise and faster closed-loop control of the lens assembly in the direction of the z-axis by using the first magnetic sensor 301 and the first induction magnet 302, thereby improving focusing and anti-shake performance of the camera module.

For example, still as shown in FIG. 3, the first magnetic sensor 301 may be disposed in the middle of the counterweight 205 on the plane xy. In this case, a distance between the first magnetic sensor 301 and the first induction magnet 302 on the optical carrier 201 is the smallest, ensuring detection precision of the first magnetic sensor 301. In addition, when the first magnetic sensor 301 is disposed in the middle of the counterweight 205, the first magnetic sensor 301 is farthest away from the first magnetic piece 202, the second magnetic piece 203, and the third magnetic piece 204. In this case, the first magnetic sensor 301 is minimally affected by the magnetic fields of the first magnetic piece 202, the second magnetic piece 203, and the third magnetic piece 204, thereby ensuring that the first magnetic sensor 301 can accurately detect a change in the magnetic fields when the first induction magnet 302 moves in the direction of the z-axis.

In some other embodiments of this application, in addition to implementing closed-loop control of movement of the lens assembly in the direction of the z-axis, the voice coil motor 200 can implement closed-loop control of movement of the lens assembly in the direction of the x-axis and the direction of the y-axis.

Figure 7:
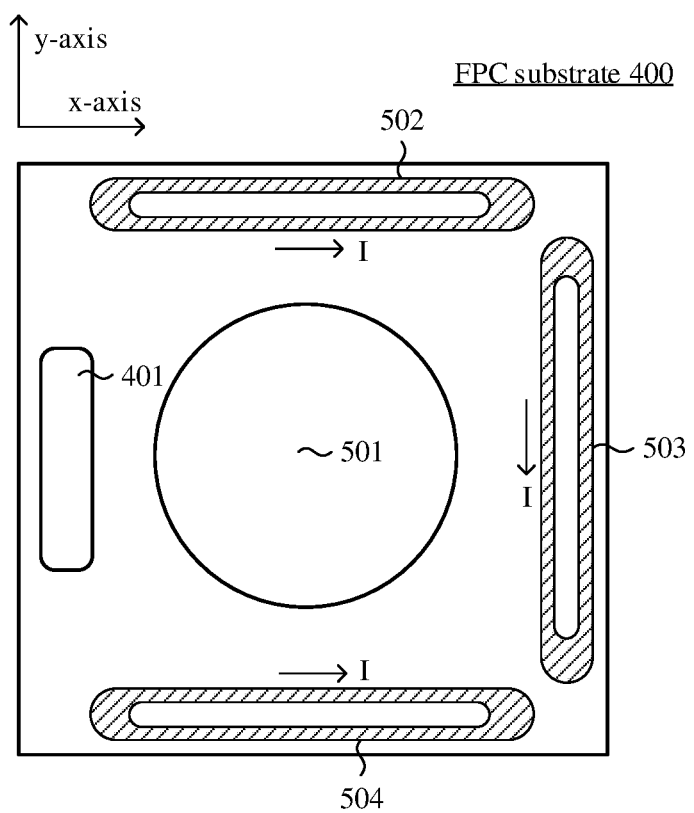
FIG. 7 is a schematic diagram 6 of a structure of a voice coil motor according to an embodiment of this application.

For example, FIG. 7 is a schematic diagram of a structure of the FPC substrate 400 on the plane xy. With reference to FIG. 5 and FIG. 7, in addition to the driver chip 401, a through-hole 501 is further disposed on the FPC substrate 400. A size and shape of the through-hole 501 match a size and shape of the optical carrier 201 on the plane xy. The optical carrier 201 can move within the through-hole 501. In addition, a second coil 502, a third coil 503, and a fourth coil 504 are further disposed around the through-hole 501. The second coil 502 and the fourth coil 504 are parallel on the plane xy, and the third coil 503 and the second coil 502 (or the fourth coil 504) are perpendicular to each other on the plane xy. With reference to FIG. 5 and FIG. 7, the second coil 502 is disposed opposite to the first magnetic piece 202 in the direction of the z-axis, the third coil 503 is disposed opposite to the second magnetic piece 203 in the direction of the z-axis, and the fourth coil 504 is disposed opposite to the third magnetic piece 204 in the direction of the z-axis.

In addition to generating the magnetic fields parallel to the y-axis, the first magnetic piece 202 and the third magnetic piece 204 can generate magnetic fields parallel to the z-axis. In this case, after being electrified, the second coil 502 may interact with the magnetic field that is of the first magnetic piece 202 and that is in the direction of the z-axis, and generate a Lorentz force parallel to the y-axis. Likewise, after being electrified, the fourth coil 504 may interact with the magnetic field that is of the third magnetic piece 204 and that is in the direction of the z-axis, and generate a Lorentz force parallel to the y-axis.

Figure 8:
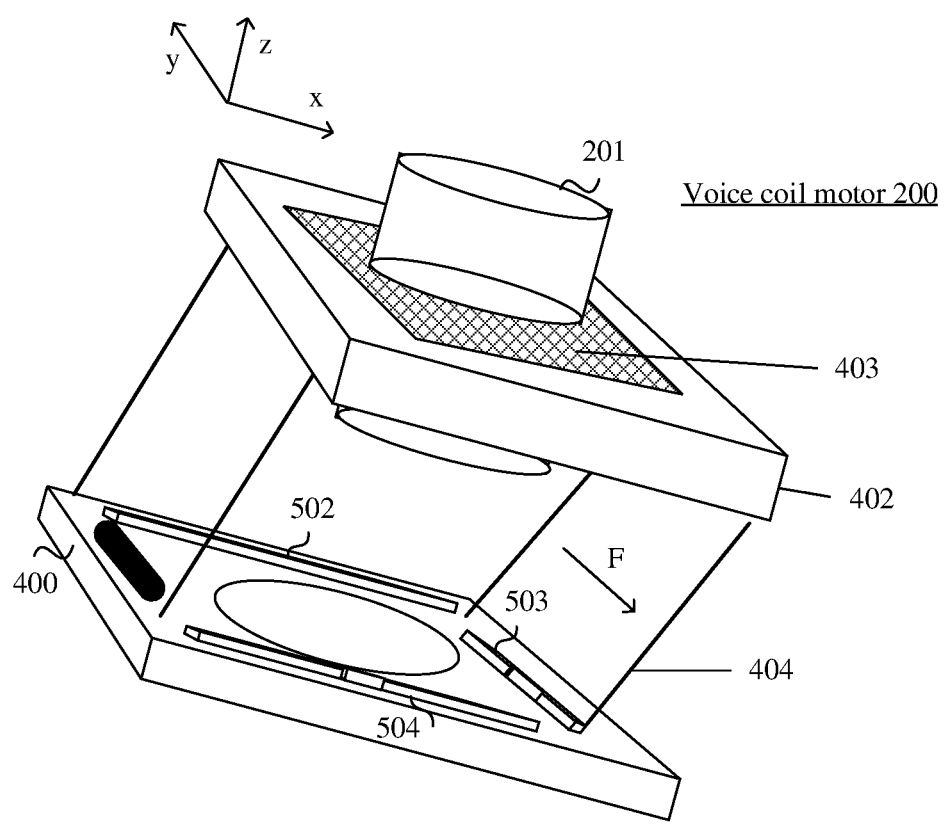
FIG. 8 is a schematic diagram 7 of a structure of a voice coil motor according to an embodiment of this application.

In this way, as shown in FIG. 8, after being electrified, the second coil 502 and the fourth coil 504 generate Lorentz forces F parallel to the y-axis in the magnetic fields. The Lorentz forces F generated by the second coil 502 and the fourth coil 504 can push the support piece 404, resulting in elastic deformation of the support piece 404, thereby driving the entire support 402 to move along the y-axis. Because the support 402 and the optical carrier 201 are connected by using the spring sheet 403, the support 402 also drives the optical carrier 201 to move in the direction of the y-axis when moving along the y-axis. In this way, the anti-shake function of the lens assembly in the optical carrier 201 is implemented.

Figure 9:
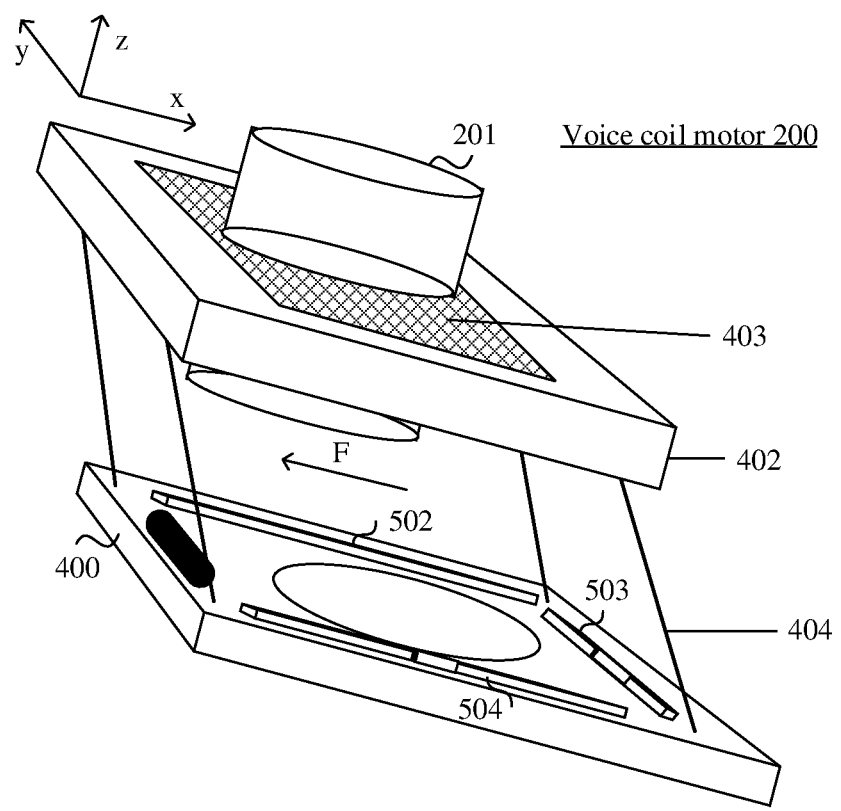
FIG. 9 is a schematic diagram 8 of a structure of a voice coil motor according to an embodiment of this application.

Likewise, as shown in FIG. 9, after being electrified, the third coil 503 may interact with the magnetic field that is of the second magnetic piece 203 (not shown in FIG. 9) and that is in the direction of the z-axis, and generate a Lorentz force F parallel to the x-axis. The Lorentz force F generated by the third coil 503 can push the support piece 404, resulting in elastic deformation of the support piece 404, thereby driving the entire support 402 to move along the x-axis. Because the support 402 and the optical carrier 201 are connected by using the spring sheet 403, the support 402 also drives the optical carrier 201 to move in the direction of the x-axis when moving along the x-axis. In this way, the anti-shake function of the lens assembly in the optical carrier 201 is implemented.

In some embodiments, the first magnetic piece 202 and the third magnetic piece 204 need to not only provide sufficient magnetic fields in the direction of the y-axis to generate Lorentz forces that are in the direction of the z-axis, but also provide sufficient magnetic fields in the direction of the z-axis to generate Lorentz forces that are in the direction of the y-axis. Therefore, the first magnetic piece 202 and the third magnetic piece 204 may be provided as bipolar magnets.

Figure 10:
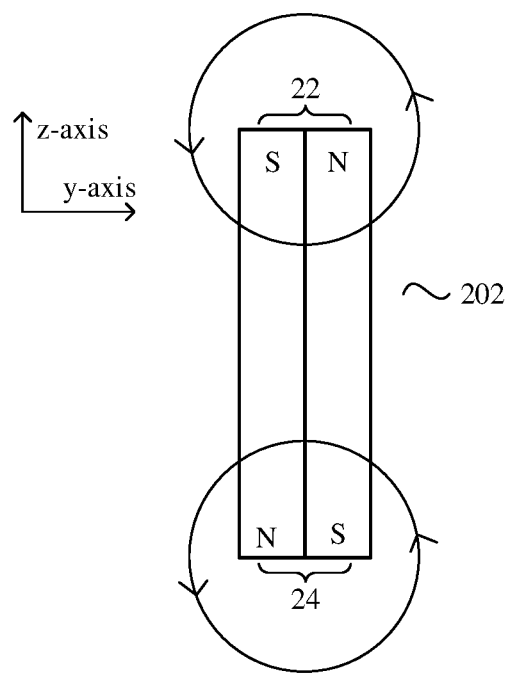
FIG. 10 is a schematic diagram of a structure of a bipolar magnet according to an embodiment of this application.

As shown in FIG. 10, when the first magnetic piece 202 (or the third magnetic piece 204) is a bipolar magnet, the first magnetic piece 202 includes two magnetic parts with opposite magnetic orientations (that is, an N pole and an S pole), namely, a first magnetic part 22 and a second magnetic part 24. The first magnetic part 22 and the second magnetic part 24 with opposite magnetic orientations form convergent magnetic fields on a plane yz on which the y-axis and the z-axis are located, reducing magnetic leakage. Therefore, sufficient magnetic field strengths are provided in the directions of the y-axis and the z-axis to generate corresponding Lorentz forces.

Certainly, a person skilled in the art may alternatively use two unipolar magnets with opposite magnetic orientations to form the first magnetic piece 202 or the third magnetic piece 204. This is not limited in this embodiment of this application.

Figure 11:
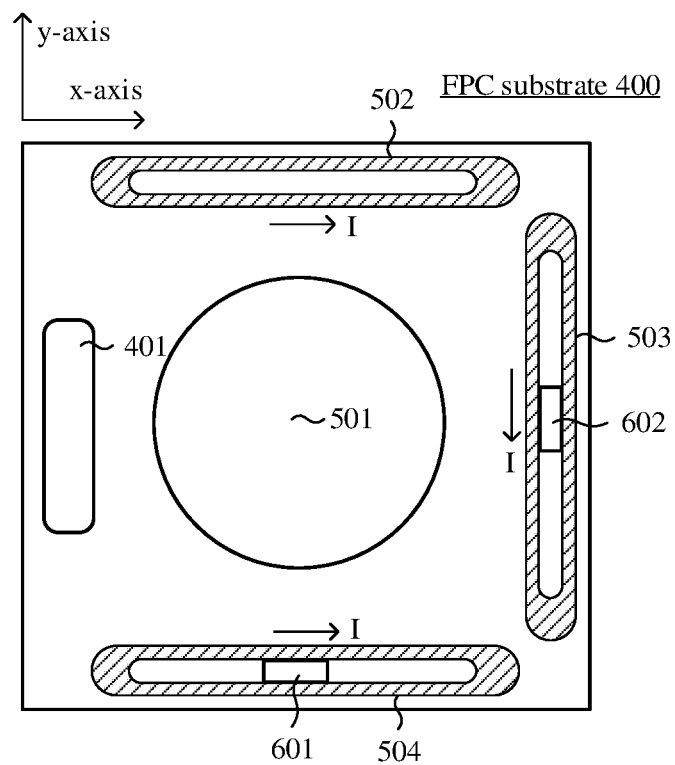
FIG. 11 is a schematic diagram 9 of a structure of a voice coil motor according to an embodiment of this application.

In this embodiment of this application, on a basis of the FPC substrate 400 shown in FIG. 7, as shown in FIG. 11, a second magnetic sensor 601 may be disposed in the second coil 502 (or the fourth coil 504), and a third magnetic sensor 602 may be disposed in the third coil 503. Similar to the first magnetic sensor 301, both the second magnetic sensor 601 and the third magnetic sensor 602 may be electrically connected to the driver chip 401 through leads.

When the third coil 503 pushes the optical carrier 201 to move in the direction of the x-axis after being electrified, the third magnetic sensor 602 may detect a change in magnetic field distribution of the second magnetic piece 203, convert a magnetic field signal sensed in real time into a corresponding electrical signal, and send the electrical signal to the driver chip 401, so that the driver chip 401 can determine a moving direction and a moving distance of the optical carrier 201 in the direction of the x-axis. In this way, the driver chip 401 may adjust, based on the moving direction and the moving distance of the optical carrier 201 in the direction of the x-axis, a magnitude of a current that is input to the third coil 503, to implement, in the direction of the x-axis, closed-loop control of movement of the lens assembly in the optical carrier 201.

Likewise, when the second coil 502 and the fourth coil 504 push the optical carrier 201 to move in the direction of the y-axis after being electrified, the second magnetic sensor 601 may detect a change in magnetic field distribution of the third magnetic piece 204, convert a magnetic field signal sensed in real time into a corresponding electrical signal, and send the electrical signal to the driver chip 401, so that the driver chip 401 can determine a moving direction and a moving distance of the optical carrier 201 in the direction of the y-axis. In this way, the driver chip 401 may adjust, based on the moving direction and the moving distance of the optical carrier 201 in the direction of the y-axis, a magnitude of a current that is input to the second coil 502 (or the fourth coil 504), to implement, in the direction of the y-axis, closed-loop control of movement of the lens assembly in the optical carrier 201.

For example, still as shown in FIG. 11, the second magnetic sensor 601 may be disposed in the middle of the second coil 502 (or the fourth coil 504). In this case, a distance between the second magnetic sensor 601 and the third magnetic piece 204 is the smallest, and the second magnetic sensor 601 is far away from interference caused by other magnetic elements, ensuring detection precision of the second magnetic sensor 601. Likewise, the third magnetic sensor 602 may be disposed in the middle of the third coil 503. In this case, a distance between the third magnetic sensor 602 and the second magnetic piece 203 is the smallest, and the third magnetic sensor 602 is far away from interference caused by other magnetic elements, ensuring detection precision of the third magnetic sensor 602.

For example, the Lorentz forces pushing the optical carrier 201 to move in the direction of the y-axis may be provided by the magnetic fields jointly generated by the first magnetic piece 202 and the third magnetic piece 204, whereas the Lorentz force pushing the optical carrier 201 to move in the direction of the x-axis is provided only by the magnetic field generated by the second magnetic piece 203. Therefore, a magnetic force generated by the second magnetic piece 203 may be set to be twice a magnetic force generated by the first magnetic piece 202 (or the third magnetic piece 204), thereby ensuring that a sufficient Lorentz force is generated to push the optical carrier 201 to move in the direction of the x-axis.

In addition, the first magnetic sensor 301, the second magnetic sensor 601, and the third magnetic sensor 602 may be specifically sensors that can convert a sensed magnetic field signal into an electrical signal, such as a Hall sensor. This is not limited in this embodiment of this application.

It can be learned that by using the first magnetic sensor 301, the second magnetic sensor 601, and the third magnetic sensor 602, the voice coil motor 200 provided in this embodiment of this application can detect movement of the lens assembly in real time in the three directions of the x-axis, the y-axis, and the z-axis, and implement closed-loop control of movement of the lens assembly, thereby quickly and precisely controlling a moving direction and a moving distance of the lens assembly and improving focusing and anti-shake performance of the entire camera module.

It may be understood that the voice coil motor 200 shown in the foregoing embodiment does not constitute a limitation on a specific internal structure of the voice coil motor 200. In some other embodiments of this application, the voice coil motor 200 may include more or fewer components than those shown in the figure, or combine some components, or split some components, or have different component arrangements.

Figure 12:
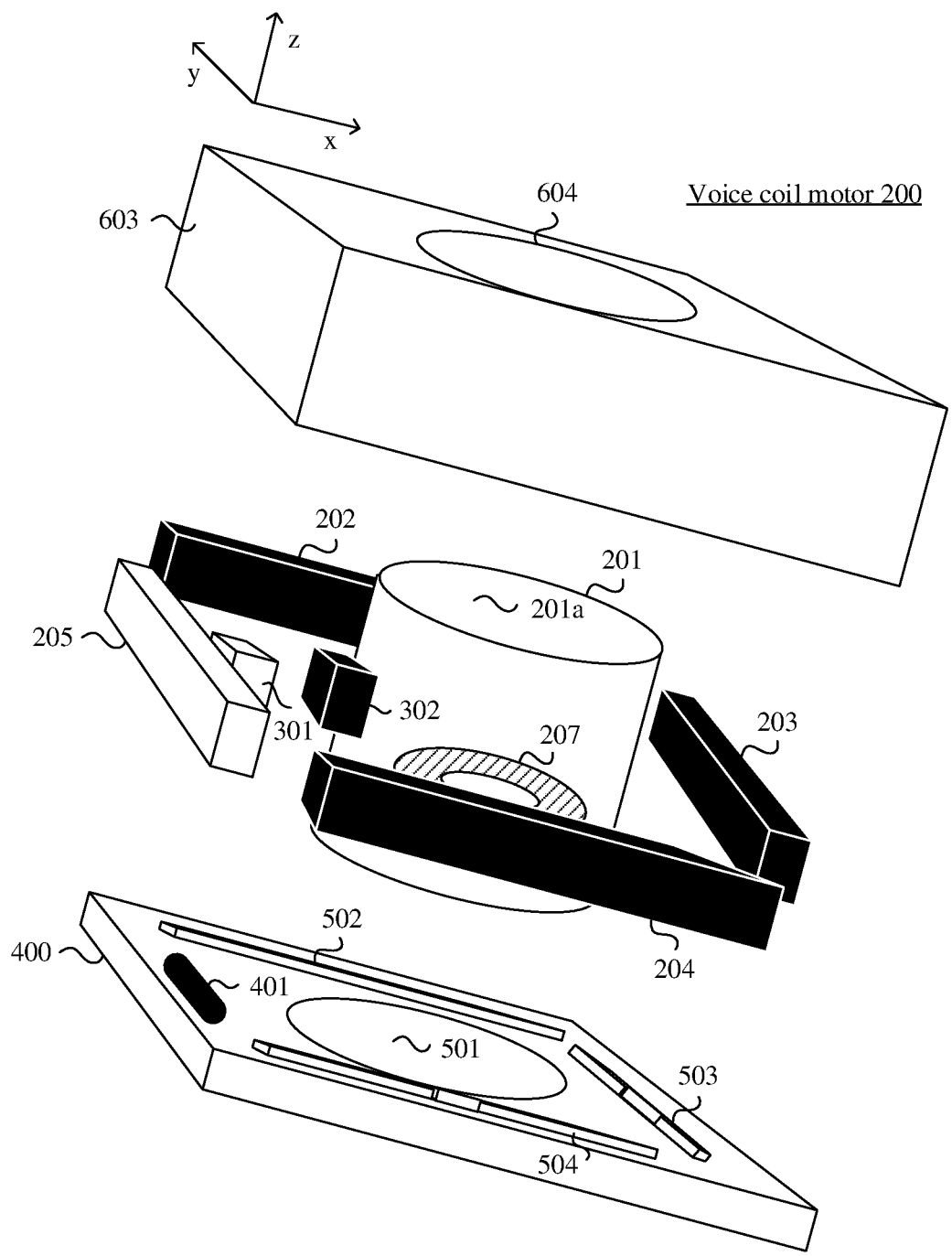
FIG. 12 is a schematic diagram 10 of a structure of a voice coil motor according to an embodiment of this application.

For example, as shown in FIG. 12, the voice coil motor 200 may further include a housing 603. The housing 603 may accommodate the optical carrier, the magnetic pieces, the coils, and the sensors in the voice coil motor 200. As shown in FIG. 8, a through-hole 604 is disposed on a surface that is of the housing 603 and that is parallel to the plane xy. A size and shape of the through-hole 604 match the size and shape of the optical carrier 201 on the plane xy. The optical carrier 201 can move in the direction of the x-axis, the y-axis, or the z-axis within the through-hole 604.

Figure 13:
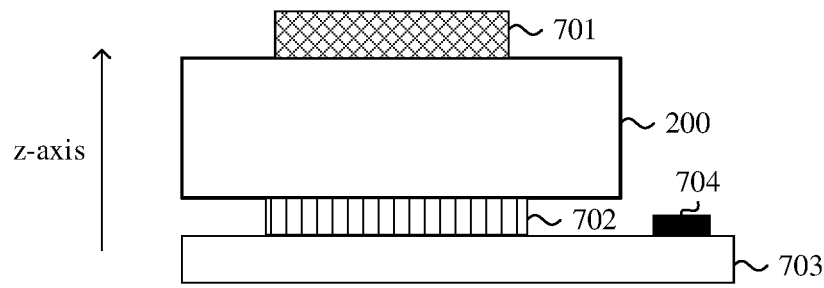
FIG. 13 is a schematic diagram 1 of a structure of a camera module according to an embodiment of this application.

In some embodiments, based on the foregoing voice coil motor 200, embodiments of this application further provide a camera module 700. FIG. 13 is a view of a section of the camera module 700 in a direction of an optical axis (that is, a z-axis). The camera module 700 is a single-camera module with only one lens assembly. The single-camera module may also be referred to as a camera unit. In this case, the camera module 700 includes only one camera unit.

The camera module 700 includes a lens assembly 701, an image sensor 702, a first substrate 703, and the foregoing voice coil motor 200. The lens assembly 701 is fastened in the optical carrier 201 of the voice coil motor 200. The image sensor 702 is disposed between the FPC substrate 400 of the voice coil motor 200 and the first substrate 703.

For example, the image sensor 702 may be a photosensitive element such as a charge coupled device (charge coupled device, CCD) or a complementary metal-oxide-semiconductor (complementary metal-oxide-semiconductor, CMOS) phototransistor. The image sensor 702 may receive, through the through-hole 501 on the FPC substrate 400, an optical signal captured by the lens assembly 701; convert the optical signal into an image electrical signal; and then send, through the first substrate 703, the image electrical signal that is obtained through conversion to a device such as an ISP (image signal processor, image signal processor) to form a digital image signal.

For example, still as shown in FIG. 13, a BTB (board to board) connector 704 may be further disposed on the first substrate 703. The first substrate 703 may transmit, through the BTB connector 704, the image electrical signal received from the image sensor 702 to another device in an electronic device, for example, a main board, a processor, or an ISP. This is not limited in this embodiment of this application.

In some other embodiments, based on the foregoing voice coil motor 200, embodiments of this application further provide a camera module 800. The camera module 800 may be a multi-camera module including a plurality of lens assemblies. In other words, the camera module 800 may include a plurality of camera units.

Figure 14A:
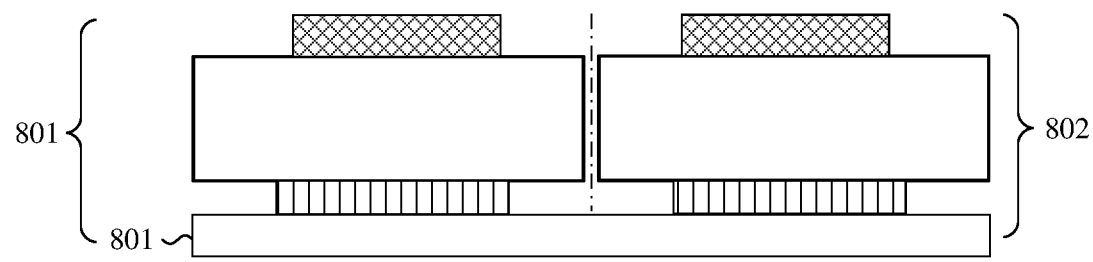
FIG. 14(a) and FIG. 14(b) are a schematic diagram 2 of a structure of a camera module according to an embodiment of this application.
Figure 14B:
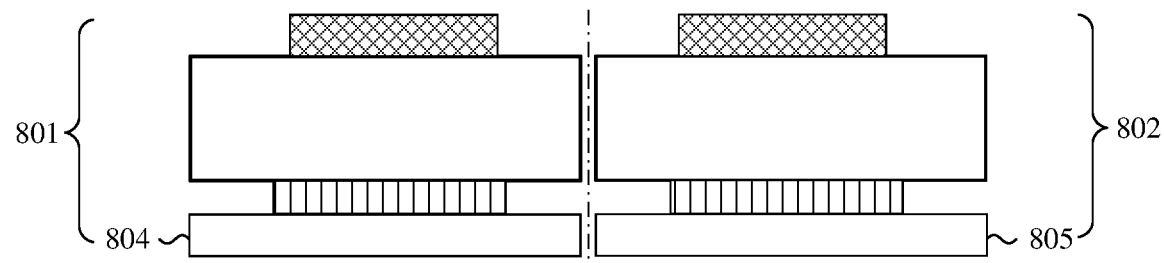

An example is used in which the camera module 800 is a dual-camera module. As shown in FIG. 14(a), the camera module 800 may include two single-camera modules, that is, a single-camera module 801 and a single-camera module 802. Each single-camera module includes devices such as a lens assembly, an image sensor, a first substrate, and a voice coil motor. As shown in FIG. 14(a), the single-camera module 801 and the single-camera module 802 may share one first substrate 803. Alternatively, as shown in FIG. 14(b), a corresponding first substrate 804 may be disposed in the single-camera module 801, and a corresponding first substrate 805 may be disposed in the single-camera module 802.

For example, at least one single-camera module in the camera module 800 may include the voice coil motor 200 described in the foregoing embodiment.

An example is used in which the single-camera module 801 includes the voice coil motor 200, but a voice coil motor in the single-camera module 802 is not the voice coil motor 200. The voice coil motor in the single-camera module 802 may be specifically a voice coil motor such as an AF (auto focus, auto-focus) motor or a four-corner magnet motor. This is not limited in this embodiment of this application.

Figures 15A, 15B:
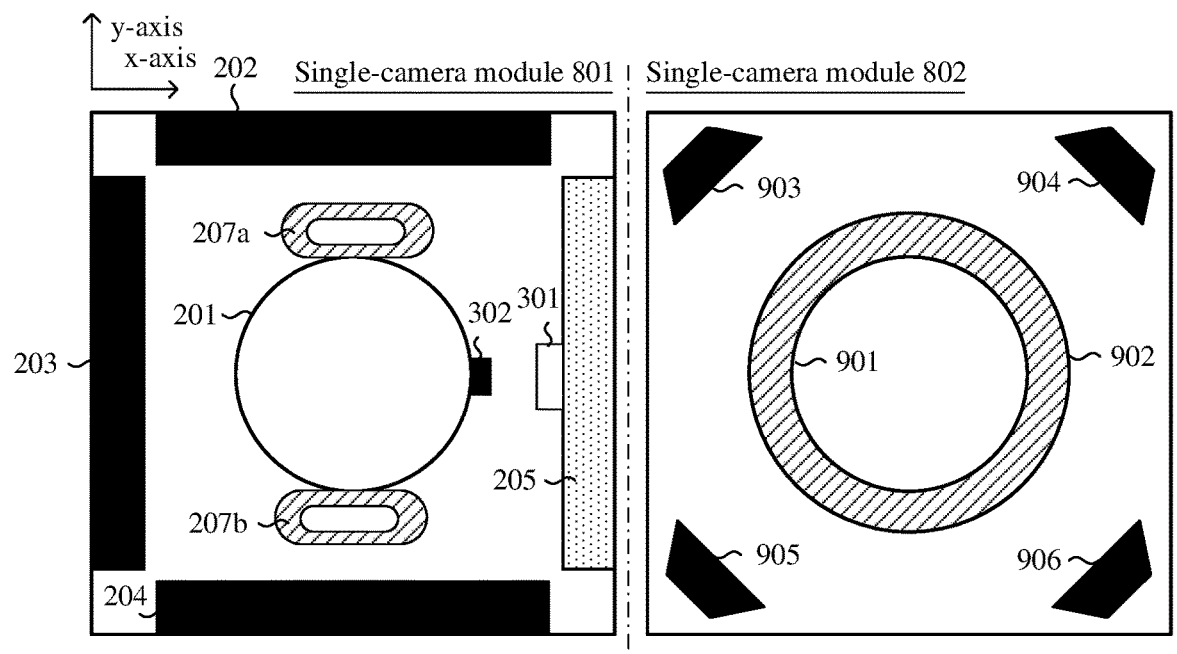
FIG. 15(a) and FIG. 15(b) are a schematic diagram 3 of a structure of a camera module according to an embodiment of this application.

For example, FIG. 15(a) is a schematic diagram of a structure of the voice coil motor 200 in the single-camera module 801 on a plane xy. For the specific structure of the voice coil motor 200 in the single-camera module 801, refer to relevant descriptions of FIG. 2 to FIG. 12 in the foregoing embodiment. Therefore, details are not described herein again.

FIG. 15(b) is a schematic diagram of a structure of a voice coil motor 900 (not shown in the figure) in the single-camera module 802 on the plane xy. The voice coil motor 900 is a motor of a four-corner magnet type. The voice coil motor 900 includes an optical carrier 901, and a coil 902 is wound on the optical carrier 901. Around an optical axis of the optical carrier 901, a first magnetic piece 903, a second magnetic piece 904, a third magnetic piece 905, and a fourth magnetic piece 906 may be respectively disposed in four corners of the voice coil motor 900. After being electrified, the coil 902 may interact with magnetic fields of the magnetic pieces and generate Lorentz forces parallel to a z-axis, to drive the optical carrier 901 to move in a direction of the z-axis.

For example, still as shown in FIG. 15(*a*) and FIG. 15(*b*), a side that is in the voice coil motor 200 in the single-camera module 801 and on which a counterweight 205 is disposed may be set to be close to the voice coil motor 900 in the single-camera module 802. Because the counterweight 205 in the voice coil motor 200 is not magnetic, setting the counterweight 205 to be close to the single-camera module 802 can effectively isolate magnetic interference caused by the magnetic pieces between the single-camera module 801 and the single-camera module 802.

Figures 16A, 16B:
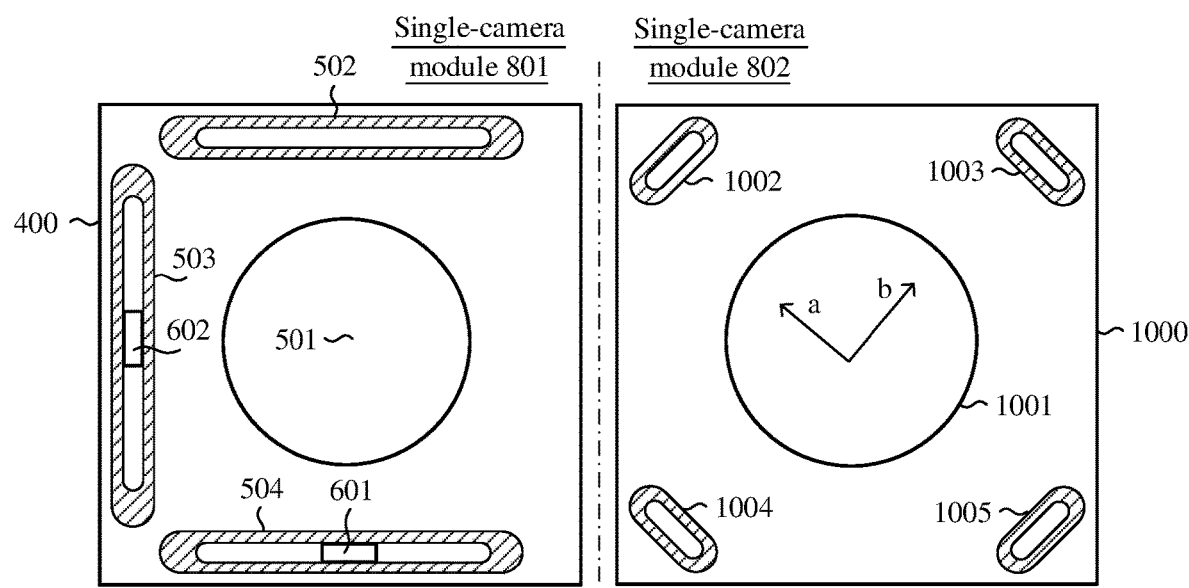
FIG. 16(a) and FIG. 16(b) are a schematic diagram 4 of a structure of a camera module according to an embodiment of this application.

Further, FIG. 16(*a*) is a schematic diagram of a structure of an FPC substrate 400 in the voice coil motor 200 in the single-camera module 801. For the specific structure of the FPC substrate 400, refer to relevant descriptions of FIG. 5 to FIG. 12. Therefore, details are not described herein again.

FIG. 16(*b*) is a schematic diagram of a structure of an FPC substrate 1000 in the voice coil motor 900 in the single-camera module 802. Likewise, a through-hole 1001 corresponding to the optical carrier 901 is disposed on the FPC substrate moo. A first coil 1002, a second coil 1003, a third coil 1004, and a fourth coil 1005 are disposed around the through-hole 1001. The first coil 1002 is disposed opposite to the first magnetic piece 903; the second coil 1003 is disposed opposite to the second magnetic piece 904; the third coil 1004 is disposed opposite to the third magnetic piece 905; and the fourth coil 1005 is disposed opposite to the fourth magnetic piece 906.

Still as shown in FIG. 16(*b*), after being electrified, the first coil 1002 and the fourth coil 1005 may generate, under actions of corresponding magnetic fields, Lorentz forces that are in a first diagonal direction a, to drive the optical carrier 901 to move in the first diagonal direction a. After being electrified, the second coil 1003 and the third coil 1004 may generate, under actions of corresponding magnetic fields, Lorentz forces that are in a second diagonal direction b, to drive the optical carrier 901 to move in the second diagonal direction b.

Figure 17:
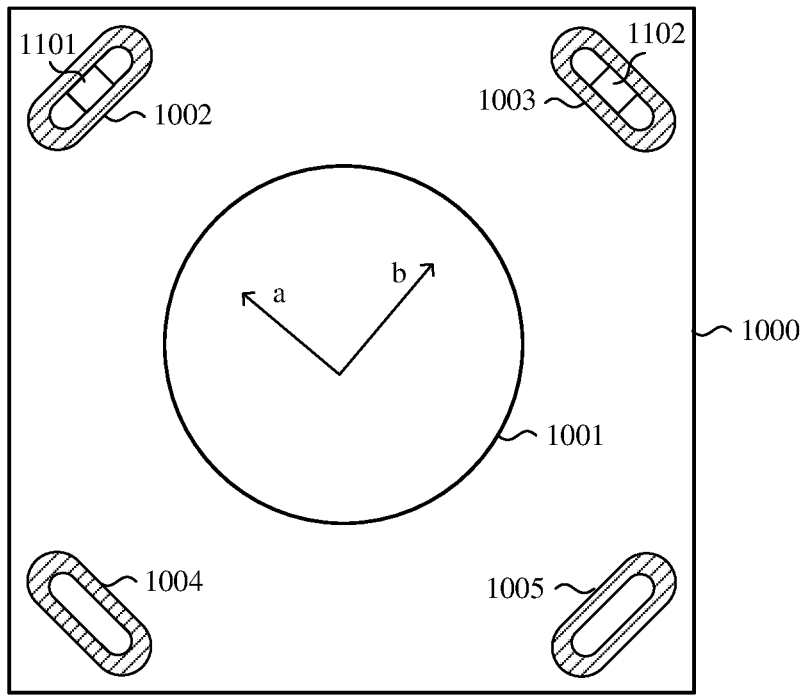
FIG. 17 is a schematic diagram 5 of a structure of a camera module according to an embodiment of this application.

For example, as shown in FIG. 17, a magnetic sensor may be disposed in any two adjacent coils of the first coil 1002, the second coil 1003, the third coil 1004, and the fourth coil 1005. For example, a first Hall sensor 1101 may be disposed in the first coil 1002, and a second Hall sensor 1102 may be disposed in the second coil 1003. In this way, when the optical carrier 901 moves in a direction of a y-axis (or an x-axis), the first Hall sensor 1101 (or the second Hall sensor 1102) may convert a sensed magnetic field change into a corresponding electrical signal, and send the electrical signal to a driver chip (not shown in the figure) on the FPC substrate 1000, so that the driver chip can implement, based on the electrical signal and in the first diagonal direction a (or the second diagonal direction b), closed-loop control of movement of the lens assembly in the optical carrier 901.

In this way, in the camera module 800, the single-camera module 801 in the camera module 800 can implement closed-loop control of movement of the lens assembly of the single-camera module 801 in the three directions of the x-axis, the y-axis, and the z-axis, and the single-camera module 802 in the camera module 800 can implement closed-loop control of movement of the lens assembly of the single-camera module 802 in the first diagonal direction a and the second diagonal direction b.

In some other embodiments, alternatively, the voice coil motors in the single-camera module 801 and the single-camera module 802 may be both set to the voice coil motor 200 described in the foregoing embodiment.

Figures 18A, 18B:
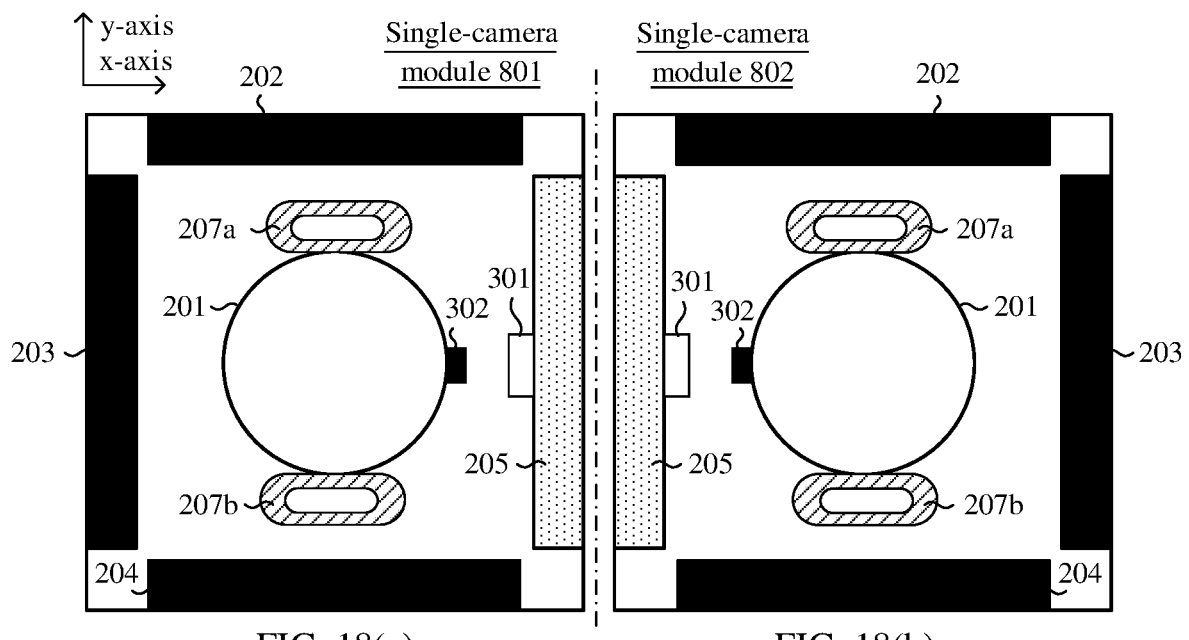
FIG. 18(a) and FIG. 18(b) are a schematic diagram 6 of a structure of a camera module according to an embodiment of this application.

In this case, FIG. 18(*a*) is a schematic diagram of a structure of the voice coil motor 200 in the single-camera module 801 on the plane xy. FIG. 18(*b*) is a schematic diagram of a structure of the voice coil motor 200 in the single-camera module 802 on the plane xy. The structure of the voice coil motor 200 in the single-camera module 801 and the structure of the voice coil motor 200 in the single-camera module 802 are disposed in mirror symmetry along a side on which counterweights 205 are located.

In other words, a side that is in the single-camera module 801 and on which the counterweight 205 is disposed is adjacent to a side that is in the single-camera module 802 and on which the counterweight 5 is disposed. In this way, magnetic pieces in the single-camera module 801 are farther away from magnetic pieces in the single-camera module 802, thereby reducing magnetic interference caused by the magnetic pieces between the single-camera module 801 and the single-camera module 802.

Figures 19A, 19B:
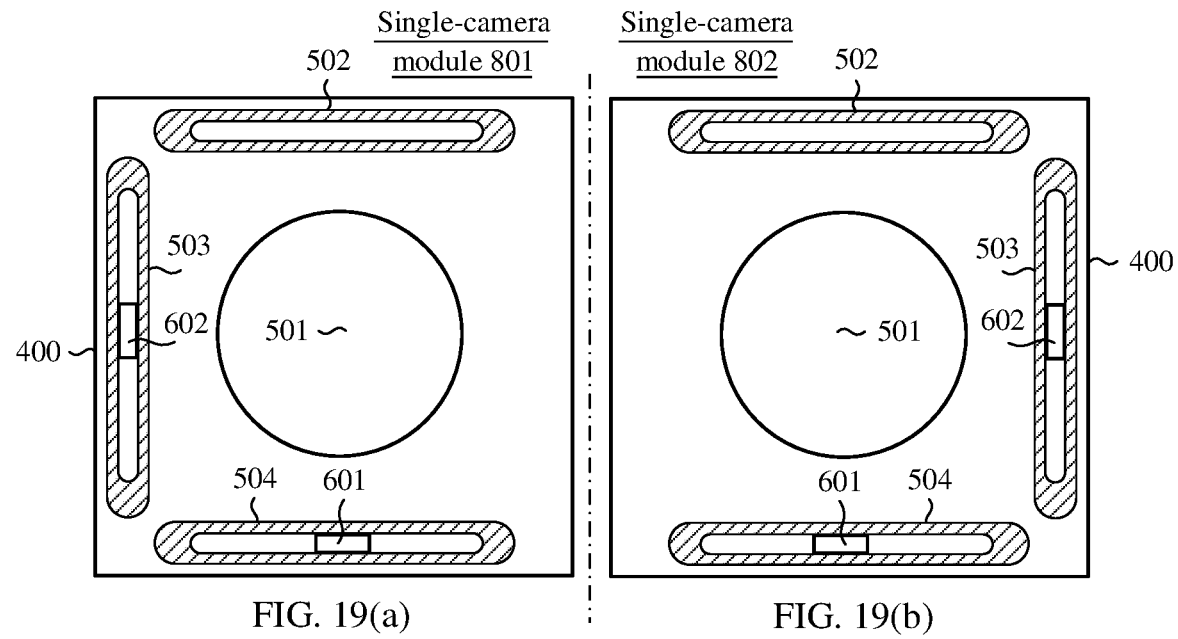
FIG. 19(a) and FIG. 19(b) are a schematic diagram 7 of a structure of a camera module according to an embodiment of this application.

Corresponding to FIG. 18(*a*) and FIG. 18(*b*), FIG. 19(*a*) is a schematic diagram of a structure of an FPC substrate 400 in the voice coil motor 200 in the single-camera module 801, and FIG. 19(*b*) is a schematic diagram of a structure of an FPC substrate 400 in the voice coil motor 200 in the single-camera module 802. Correspondingly, the two FPC substrates are also disposed in mirror symmetry. For the specific structures of the voice coil motor 200 and the FPC substrate 400 in the voice coil motor 200, refer to relevant descriptions of FIG. 2 to FIG. 12 in the foregoing embodiment. Therefore, details are not described herein again.

When the voice coil motors in the single-camera module 801 and the single-camera module 802 are both the voice coil motor 200, each single-camera module in the camera module Boo can implement closed-loop control of movement of a lens assembly of the single-camera module in three directions of an x-axis, a y-axis, and a z-axis. In this way, focusing and anti-shake performance of the entire camera module Boo is improved.

Certainly, the voice coil motor 200 may be alternatively disposed in a camera module with three or more lens assemblies. This is not limited in this embodiment of this application.

Figure 20:
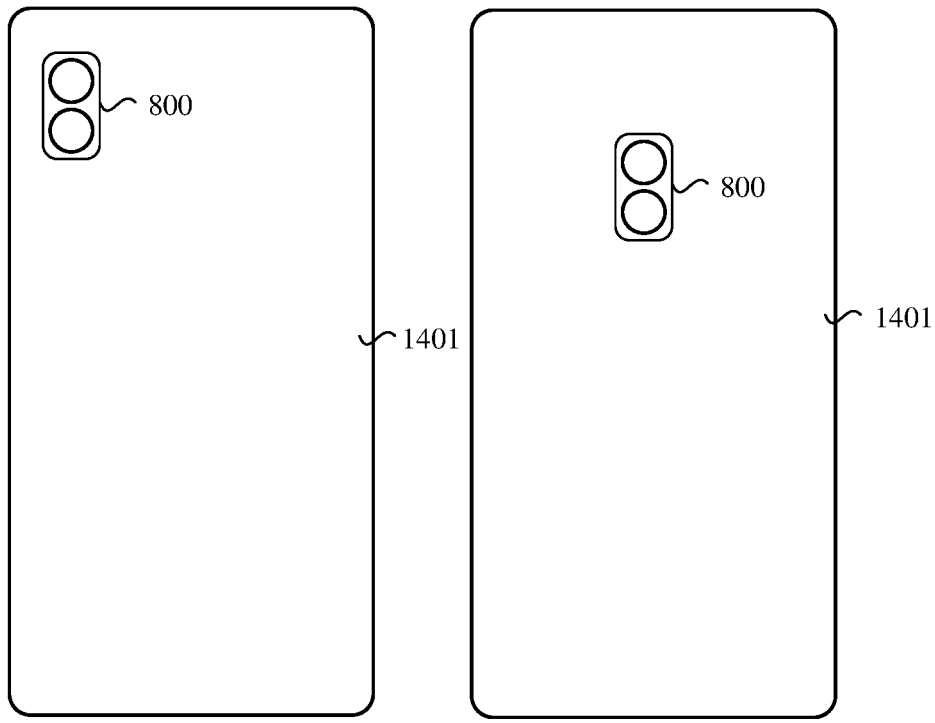
FIG. 20 is a schematic diagram of a structure of an electronic device according to an embodiment of this application.

An embodiment of this application further provides an electronic device. A camera module with the voice coil motor 200, for example, the camera module 700 or the camera module 800, may be disposed in the electronic device. The camera module 800 is used as an example. As shown in FIG. 20, the camera module 800 may be disposed at any position on a rear housing 1401 of the electronic device. Certainly, the camera module 800 may be alternatively disposed on a front panel of or at another position on the electronic device. This is not limited in this embodiment of this application.

The electronic device may be specifically an electronic device with a camera function such as a mobile phone, a tablet computer, a notebook computer, an ultra-mobile personal computer (ultra-mobile personal computer, UMPC), a handheld computer, a netbook, a personal digital assistant (personal digital assistant, PDA), a wearable electronic device, a vehicle-mounted device, or a virtual reality device. This is not limited in this embodiment of this application.

For example, in addition to the camera module with the voice coil motor 200, the electronic device may further include a processor, an external memory interface, an internal memory, a universal serial bus (universal serial bus, USB) interface, an antenna, a mobile communication module, a wireless communication module, an audio module, a speaker, a receiver, a microphone, a headset jack, a sensor module, a charging management module, a power management module, a battery, a key, an indicator, one or more SIM card interfaces, and the like. This is not limited in this embodiment of this application.

The foregoing descriptions are merely specific implementations of embodiments of this application, but are not intended to limit the protection scope of embodiments of this application. Any variation or replacement within the technical scope disclosed in embodiments of this application shall fall within the protection scope of embodiments of this application. Therefore, the protection scope of embodiments of this application shall be subject to the protection scope of the claims.

What is claimed is:

1. A voice coil motor, comprising:
    a first magnetic piece;
    a second magnetic piece;
    a third magnetic piece; and
    a counterweight, wherein the first magnetic piece, the second magnetic piece, the third magnetic piece, and the counterweight are radially and sequentially arranged around an optical carrier;
    a first plurality of coils that are symmetrically fastened on two sides of the optical carrier, wherein the first plurality of coils comprises a first coil and a second coil, the first coil is disposed opposite the first magnetic piece, and the second coil is disposed opposite the third magnetic piece;
    a first magnetic sensor; and
    a first induction magnet disposed opposite the first magnetic sensor, wherein the first magnetic sensor is disposed on a side that is of the counterweight and that faces an outer wall of the optical carrier and the first induction magnet, and wherein the first induction magnet is fastened on a surface of the outer wall that is of the optical carrier and that is adjacent to the counterweight, the surface of the outer wall of the optical carrier being a closest surface of the optical carrier to the first magnetic sensor; and
    wherein coils of the first plurality of coils are configured to drive the optical carrier to move in a direction of an optical axis with the first induction magnet, and wherein the first magnetic sensor is configured to convert a magnetic field signal generated by the first induction magnet into a first electrical signal.

2. The voice coil motor according to claim 1, wherein, on a plane perpendicular to the direction of the optical axis, a distance between the first induction magnet and the first magnetic piece and a distance between the first induction magnet and the third magnetic piece are equal.

3. The voice coil motor according to claim 1, wherein the first magnetic sensor is located in a middle of the counterweight on a plane perpendicular to the direction of the optical axis.

4. The voice coil motor according to claim 1, wherein at least one of:
    a surface of the first magnetic sensor is mounted on the counterweight; or
    the first magnetic sensor is fastened on the counterweight using a support part.

5. The voice coil motor according to claim 1, wherein at least one of:
    a height of the first magnetic sensor in the direction of the optical axis is the same as a height of the counterweight; or
    a height of the first magnetic sensor in the direction of the optical axis is different than a height of the counterweight.

6. The voice coil motor according to claim 1, wherein the counterweight comprises a magnetic insulating material.

7. The voice coil motor according to claim 1, wherein the first magnetic piece and the third magnetic piece are centrosymmetrically disposed with respect to the optical carrier; and
    wherein the second magnetic piece and the counterweight are centrosymmetrically disposed with respect to the optical carrier.

8. The voice coil motor according to claim 1, further comprising a flexible printed circuit (FPC) substrate, wherein a driver chip is disposed on the FPC substrate; and
    wherein the driver chip is configured to receive the first electrical signal transmitted by the first magnetic sensor, and to adjust, based on the first electrical signal, a first current signal that is input to the first plurality of coils.

9. The voice coil motor according to claim 8, wherein a through-hole, and a fifth coil, a third coil, and a fourth coil are radially arranged around the through-hole sequentially and are disposed on the FPC substrate, wherein a second magnetic sensor is disposed in the fourth coil, and wherein a third magnetic sensor is disposed in the third coil;
    wherein the fifth coil is disposed opposite the first magnetic piece, wherein the third coil is disposed opposite the second magnetic piece, and wherein the fourth coil is disposed opposite the third magnetic piece;
    wherein the fifth coil is configured to drive the optical carrier to move in a first direction with the first magnetic piece, and wherein the second magnetic sensor is configured to convert a magnetic field signal generated by the third magnetic piece into a second electrical signal; and
    wherein the third coil is configured to drive the optical carrier to move in a second direction with the second magnetic piece, and wherein the third magnetic sensor is configured to convert a magnetic field signal generated by the second magnetic piece into a third electrical signal, and wherein the first direction and the second direction are perpendicular to each other, and both the first direction and the second direction are perpendicular to the direction of the optical axis.

10. The voice coil motor according to claim 9, wherein the driver chip is further configured to receive the second electrical signal transmitted by the second magnetic sensor, and adjust, based on the second electrical signal, a second current signal that is input to the fourth coil; and
    wherein the driver chip is further configured to receive the third electrical signal transmitted by the third magnetic sensor, and to adjust, based on the third electrical signal, a third current signal that is input to the third coil.

11. The voice coil motor according to claim 9, wherein the first magnetic sensor, the second magnetic sensor, or the third magnetic sensor are each a Hall sensor.

12. The voice coil motor according to claim 1, wherein the first magnetic piece and the third magnetic piece are bipolar magnets, and wherein the second magnetic piece is a unipolar magnet.

13. The voice coil motor according to claim 1, wherein a magnetic force generated by the first magnetic piece is equal to a magnetic force generated by the third magnetic piece, and wherein a magnetic force generated by the second magnetic piece is twice the magnetic force generated by the first magnetic piece.

14. The voice coil motor of claim 1, wherein the first induction magnet is fastened on the outer wall of the optical carrier such that there is no relative movement between the first induction magnet and the optical carrier when the optical carrier moves relative to the counterweight.

15. An electronic device, comprising:
  a non-transitory memory;
  one or more processors; and
  one or more camera modules;
  wherein a camera module of the one or more camera modules comprises at least one camera unit comprising an optical carrier, a lens assembly mounted in the optical carrier, a first magnetic piece, a second magnetic piece, a third magnetic piece, and a counterweight that are radially and sequentially arranged around the optical carrier;
  wherein a first plurality of coils are symmetrically disposed on two sides of the optical carrier, wherein the first plurality of coils comprises a first coil and a second coil, the first coil is disposed opposite to the first magnetic piece, and the second coil is disposed opposite to the third magnetic piece;
  wherein the camera unit further comprises a first magnetic sensor disposed opposite a first induction magnet that, wherein the first magnetic sensor is disposed on a side that is of the counterweight and that faces an outer wall of the optical carrier and the first induction magnet, and wherein the first induction magnet is fastened on a surface of the outer wall that is of the optical carrier and that is adjacent to the counterweight, the surface of the outer wall of the optical carrier being a closest surface of the optical carrier to the first magnetic sensor; and
  wherein the first plurality of coils are configured to drive the optical carrier to move in a direction of an optical axis with the first induction magnet, and wherein the first magnetic sensor is configured to convert a magnetic field signal generated by the first induction magnet into a first electrical signal.

16. The electronic device according to claim 15, wherein the camera module further comprises flexible printed circuit (FPC) substrate, wherein a driver chip is disposed on the FPC substrate; and
  wherein the driver chip is configured to receive the first electrical signal transmitted by the first magnetic sensor, and to adjust, based on the first electrical signal, a first current signal that is input to the first plurality of coils.

17. The electronic device according to claim 16, wherein a through-hole is disposed on the FPC substrate, and wherein a fifth coil, a third coil, and a fourth coil are radially and sequentially arranged around the through-hole and are further disposed on the FPC substrate, wherein a second magnetic sensor is disposed in the fourth coil, and a third magnetic sensor is disposed in the third coil;
  wherein the fifth coil is disposed opposite the first magnetic piece, wherein the third coil is disposed opposite the second magnetic piece, and wherein the fourth coil is disposed opposite the third magnetic piece;
  wherein the fifth coil is configured to drive the optical carrier to move in a first direction with the first magnetic piece, and wherein the second magnetic sensor is configured to convert a magnetic field signal generated by the third magnetic piece into a second electrical signal; and
  wherein the third coil is configured to drive the optical carrier to move in a second direction with the second magnetic piece, and wherein the third magnetic sensor is configured to convert a magnetic field signal generated by the second magnetic piece into a third electrical signal, wherein the first direction and the second direction are perpendicular to each other, and wherein both the first direction and the second direction are perpendicular to the direction of the optical axis.

18. The electronic device according to claim 17, wherein the driver chip is further configured to receive the second electrical signal transmitted by the second magnetic sensor, and to adjust, based on the second electrical signal, a second current signal that is input to the fourth coil; and
  wherein the driver chip is further configured to receive the third electrical signal transmitted by the third magnetic sensor, and to adjust, based on the third electrical signal, a third current signal that is input to the third coil.

19. The electronic device according to claim 17, wherein the camera module further comprises an image sensor that is disposed under the FPC substrate in the direction of the optical axis, wherein the image sensor receives, through the through-hole on the FPC substrate, an optical signal captured by the lens assembly, and converts the optical signal into an image electrical signal.

20. The electronic device according to claim 19, wherein the camera module further comprises a substrate that is disposed under the image sensor in the direction of the optical axis, wherein a board to board (BTB) connector is disposed on the substrate; and
  wherein the substrate is configured to receive the image electrical signal that is output by the image sensor, and output the image electrical signal using the BTB connector.

* * * * *